(12) United States Patent
Piquette et al.

(10) Patent No.: US 11,584,882 B2
(45) Date of Patent: Feb. 21, 2023

(54) WAVELENGTH CONVERTER; METHOD OF ITS MAKING AND LIGHT-EMITTING DEVICE INCORPORATING THE ELEMENT

(71) Applicant: OSRAM Opto Semiconductors GmbH, Regensburg (DE)

(72) Inventors: Alan Piquette, Kensington, NH (US); Maxim N. Tchoul, Winchester, MA (US); David W. Johnston, Exeter, NH (US); Gertrud Kraeuter, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 325 days.

(21) Appl. No.: 16/791,941

(22) Filed: Feb. 14, 2020

(65) Prior Publication Data
US 2021/0253945 A1 Aug. 19, 2021

(51) Int. Cl.
 *C09K 11/02* (2006.01)
 *C08K 3/013* (2018.01)
 *C08G 77/18* (2006.01)
 *H01L 33/50* (2010.01)

(52) U.S. Cl.
 CPC ............... *C09K 11/02* (2013.01); *C08G 77/18* (2013.01); *C08K 3/013* (2018.01); *H01L 33/502* (2013.01)

(58) Field of Classification Search
 CPC ........ C09K 11/02; C08G 77/18; C08K 3/013; H01L 33/502; H01L 2933/0041; H01L 33/501
 See application file for complete search history.

(56) References Cited

U.S. PATENT DOCUMENTS

| | | | |
|---|---|---|---|
| 2012/0126282 A1* | 5/2012 | Tanikawa | C08L 83/14 252/301.36 |
| 2015/0188007 A1* | 7/2015 | Mochizuki | C08K 5/5435 252/301.36 |
| 2016/0347997 A1* | 12/2016 | Tchoul | C09K 11/02 |
| 2018/0047796 A1* | 2/2018 | Kundaliya | H01L 27/3213 |
| 2018/0198033 A1 | 7/2018 | Bohmer et al. | |
| 2018/0340119 A1 | 11/2018 | Piquette et al. | |

FOREIGN PATENT DOCUMENTS

| | | |
|---|---|---|
| EP | 3159373 A1 | 4/2017 |
| EP | 3511377 A1 | 7/2019 |
| WO | 2019177689 A1 | 9/2019 |

* cited by examiner

*Primary Examiner* — Jonathan Han
(74) *Attorney, Agent, or Firm* — Slater Matsil, LLP (57) ABSTRACT

The present invention is directed to a wavelength converter comprising a non-luminescent substrate layer, at least one polysiloxane layer, wherein at least one of the polysiloxane layers comprises a phosphor material.
Furthermore, the present invention is directed to a method for preparing a wavelength converter, a light emitting device and a method for preparing a light emitting device.

7 Claims, 7 Drawing Sheets

WAVELENGTH CONVERTER; METHOD OF ITS MAKING AND LIGHT-EMITTING DEVICE INCORPORATING THE ELEMENT

TECHNICAL FIELD

The invention relates to the field of solid-state lighting and more specifically to LED technology.

BACKGROUND

In the optoelectronic industry down-conversion elements, i.e., wavelength converters, are used that can efficiently down-convert higher energy light into lower energy light. More specifically, the conversion element needs to down-convert blue light (or violet, or near-UV light) into light with longer wavelengths, e.g., cyan, green, yellow, orange, red, and/or near-IR. For high power applications, the down-conversion elements must be stable at elevated temperatures for prolonged periods of time, e.g., >200° C. for thousands of hours.

There are several down-conversion options available in LED (light emitting diode) products today. The most common forms of down-conversion elements are i) ceramic converters, ii) phosphor-in-glass converters, iii) phosphor-in-silicone converters, and iv) phosphor-in-silicone-on-glass converters. Ceramic and phosphor-in-glass converters are stable at high temperatures. However, certain compositions do not lend themselves to being made into ceramic or phosphor-in-glass form. For example, it is often difficult to densify certain nitride or oxynitride phosphors into efficient ceramics. Sometimes, it is also difficult to incorporate certain nitride or oxynitride phosphor powders into a glass matrix without damaging the phosphor powder. The high temperatures required to melt the glass often end up damaging the phosphor. The situation is different for phosphor-in-silicone and phosphor-in-silicone-on-glass conversion elements. In this case, incorporating any phosphor powder or combination of phosphor powders is more-or-less possible. However, even the most stable optical silicones are often not stable enough to operate for long periods of time at temperatures near or above 200° C.

SUMMARY

It is an object of the present invention to obviate the disadvantages of the prior art.

It is another object of the present invention to provide a wavelength converter.

It is another object of the present invention to provide a method for preparing a wavelength converter.

It is another object of the present invention to provide a wavelength converter prepared by a method of the present invention.

It is another object of the present invention to provide a light emitting device comprising a wavelength converter of the present invention.

It is another object of the present invention to provide a method for preparing a light emitting device according to the present invention.

It is another object of the present invention to provide a use of a light emitting device of the present invention.

The invention is directed to a wavelength converter comprising a non-luminescent substrate layer, and at least one polysiloxane layer, wherein at least one of the polysiloxane layers comprises a phosphor material.

The invention is further directed to a method for preparing a wavelength converter, the method comprising providing a non-luminescent substrate layer, providing a slurry comprising a polysiloxane precursor material and a phosphor material, depositing the slurry on the non-luminescent substrate layer, application of a first cure step, and application of a second cure step.

The invention is further directed to a method for preparing a light emitting device, the method comprising the steps of providing a light source, depositing a wavelength converter according to the present invention on a non-luminescent substrate, wherein the polysiloxane layer comprising the phosphor material is in close proximity to the light source.

BRIEF DESCRIPTION OF THE DRAWINGS

The invention is explained in more detail below on the basis of the examples and with reference to the associated figures. The figures are diagrammatic and do not represent illustrations that are true to scale.

DETAILED DESCRIPTION OF ILLUSTRATIVE EMBODIMENTS

For a better understanding of the present invention, together with other and further objects, advantages and capabilities thereof, reference is made to the following disclosure and appended claims taken in conjunction with the above-described drawings.

References to the color of the phosphor, LED, or phosphor material refer generally to its emission color unless otherwise specified. Thus, a blue LED emits a blue light, a yellow phosphor emits a yellow light and so on.

The present invention is directed to a wavelength converter comprising a non-luminescent substrate layer and at least one polysiloxane layer, wherein at least one of the polysiloxane layers comprises a phosphor material.

As used herein a wavelength converter is a solid structure that converts at least part of light of a certain first wavelength to light of a certain second wavelength.

According to the present invention, the wavelength converter comprises a non-luminescent substrate layer. The non-luminescent substrate layer is preferably a solid layer.

A non-luminescent substrate layer is a substrate layer that does not emit light.

In an embodiment, the non-luminescent substrate layer is selected from all types of glass, such as borosilicate glass, sapphire, fused silica and polycrystalline ceramics.

The non-luminescent substrate layer may have a thickness of between about 30 µm and about 300 µm, preferably between about 70 µm and about 260 µm. According to the present invention, the thickness defines the shortest distance between two opposing surfaces of a structure.

The surfaces of the non-luminescent substrate layer may be optically smooth, or roughened on at least one of the sides of the substrate layer, or on all sides of the substrate layers. In addition, or alternatively, one or more of the surfaces of the non-luminescent substrate can have an optical structur- ing incorporated, such as an anti-reflective coating, a distributed Bragg reflector, a photonic crystal, aperiodic arrays of dielectric nanomaterials, or meta-lenses.

In a preferred embodiment, the non-luminescent substrate layer is a borosilicate glass layer. The borosilicate substrate layer may have a thickness in the range from about 30 μm to about 300 μm, preferably in a range from about 70 μm to about 260 m.

According to the present invention, the wavelength converter comprises at least one polysiloxane layer, wherein at least one of the polysiloxane layers comprises a phosphor material. Therefore, the polysiloxane layer may be described as a polysiloxane matrix in which the phosphor material is intercalated.

The wavelength converter may comprise one polysiloxane layer, or more polysiloxane layers, such as two, three, four or five polysiloxane layers.

In an embodiment of the present invention, the polysiloxane layer comprises a polysiloxane of formula (I):

(I)

wherein 0.65≤a≤1 and 0≤b<0.35 and 0≤c<0.35 and a+b+c=1, preferably, wherein 0.8≤a≤1 and 0≤b<0.2 and 0≤c<0.2; $T^1$ is independently selected from a linear or branched alkyl (e.g., $C_1$-$C_4$ alkyl) and alkoxy (e.g., $C_1$-$C_4$ alkoxy); $T^2$ is a linear or branched alkyl (e.g. $C_1$-$C_4$ alkyl); $R^1$, $R^2$ and $R^3$ are independently selected from a linear or branched alkyl (e.g., $C_1$-$C_4$ alkyl) and phenyl. The " . . . " sign in formula (I) indicates the continuation of the siloxane structure. The alkyl may be $C_1$-$C_4$ alkyl (i.e., methyl, ethyl, propyl, butyl), wherein methyl is preferred.

In an embodiment, $R^1$ to $R^3$ is methyl, $T^1$ is methoxy and $T^2$ is methyl. In a further embodiment $R^1$ to $R^3$ is phenyl, $T^1$ is methoxy and $T^2$ is methyl. In an alternative embodiment $R^1$ to $R^3$ are independently selected from methyl and phenyl. In an alternative embodiment $R^1$ could be any combination of methyl and phenyl, $R^2$ could be any combination of methyl and phenyl, and $R^3$ could be any combination of methyl and phenyl.

The polysiloxane might comprise siloxane units according to Table 1.

TABLE 1

| Monomeric unit (R = generic functional group) | Abbreviation |
|---|---|
| ~~O—Si(R)(R)—R (structure) | M |
| ~~O—Si(R)—O~~ (structure) | D |

TABLE 1-continued

| Monomeric unit (R = generic functional group) | Abbreviation |
|---|---|
| ~~O—Si(O~)(R)—O~~ (structure) | T |
| ~~O—Si(O~)(O~)—O~~ (structure) | Q |

Preferably, the siloxane monomer unit of the polysiloxane of the present invention is of T-type only, i.e., 100% of the monomeric units belong to the T-type. Alternatively, the siloxane monomer units of the polysiloxane of the present invention are of T-type and D-type, i.e., the amount of T-type is between about 65% and about 100% and the amount of D-type is between about 35% and about 0%, wherein the overall amount of T-type and D-type monomer units in the polysiloxane is 100%.

Alternatively, the siloxane monomer units of the polysiloxane of the present invention are of T-type, D-type and Q-type, i.e. the amount of T-type is between 65% and about 100% and of the D-type and Q-type is between 35% and 0%, wherein the overall amount of T, D and Q-type monomer units is 100%.

Differences that may be present between standard optical silicones and the polysiloxanes used in the present invention are mentioned in Table 2.

TABLE 2

| | Standard | Polysiloxane |
|---|---|---|
| Primary Si—O bond type (see Table 1) | D-unit | T-unit |
| Curing Method | Addition (Catalyst -> typically Platinum based) | Hydrolysis/ Condensation (Catalyst -> typically Titanium Alkoxide based) |
| Presence of C—C bond(s) in the network* | Yes | No |
| Typical viscosity range of the uncured material(s) | > 500 mPa · s | <500 mPa · s |
| Typical molecular weight of the uncured material(s) | >4500 g/mol | <4500 g/mol |
| Mass loss upon curing | Little to no mass loss | Up to 30% mass loss, or in rare cases even higher |
| Hardness increase (N/mm) of cured material upon thermal storage at temperatures >220° C. for 1000 hours | >40% | <40.% |
| Mass loss of cured material upon thermal storage at temperatures >200° C. for 1000 hours | >4 wt. % | <4 wt. % |

*Side groups that are not involved in the network bonding are not considered here.

According to the present invention, the polysiloxane layer comprises a phosphor material. As used herein, a phosphor material is a material that converts light of a certain first wavelength to light of a certain second wavelength.

The phosphor material might be one kind of phosphor material, or might be a mixture of different phosphor materials.

The phosphor material might be present in the polysiloxane in all different kinds known in the state of the art. The phosphor material might be present as crystalline powder, polycrystalline powder, semi-crystalline powder, amorphous powder and/or quantum dots.

The phosphor may be any phosphor that is known to absorb light in the near UV to blue region of the spectrum and emit the light in the visible region of the spectrum, or any combination of known phosphors.

The phosphor material might be an inorganic compound. Exemplary phosphors are garnets, oxynitridosilicates, perovskites, silicates or combinations thereof, each doped with at least one appropriate element.

Non-limiting examples of phosphor materials are:
$(RE_{1-x}Ce_x)_3(Al_{1-y}A'_y)_5O_{12}$ with $0<x\leq0.1$ and $0\leq y\leq1$,
$(RE_{1-x}Ce_x)_3(Al_{5-2y}Mg_ySi_y)O_{12}$ with $0\leq x\leq0.1$ and $0\leq y\leq2$,
$(RE_{1-x}Ce_x)_3Al_{5-y}Si_yO_{12-y}N_y$ with $0\leq x\leq0.1$ and $0\leq y\leq0.5$,
$(RE_{1-x}Ce_x)_2CaMg_2Si_3O_{12}:Ce^{3+}$ with $0<x\leq0.1$,
$(AE_{1-x}Eu_x)_2Si_5N_8$ with $0<x\leq0.1$,
$(AE_{1-x}Eu_x)AlSiN_3$ with $0<x\leq0.1$,
$(AE_{1-x}Eu_x)_2Al_2Si_2N_6$ with $0<x\leq0.1$,
$(Sr_{1-x}Eu_x)LiAl_3N_4$ with $0<x\leq0.1$,
$(AE_{1-x}Eu_x)_3Ga_3N_5$ with $0<x\leq0.1$,
$(AE_{1-x}Eu_x)Si_2O_2N_2$ with $0<x\leq0.1$,
$(AE_xEu_y)Si_{12-2x-3y}Al_{2x+3y}O_yN_{16-y}$ with $0.2\leq x<2.2$ and $0<y\leq0.1$,
$(AE_{1-x}Eu_x)_2SiO_4$ with $0<x\leq0.1$,
$(AE_{1-x}Eu_x)_3Si_2O_5$ with $0<x\leq0.1$,
$K_2(Si_{1-x-y}Ti_yMn_x)F_6$ with $0<x\leq0.2$ and $0<y\leq1-x$,
$(AE_{1-x}Eu_x)_5(PO_4)_3Cl$ with $0<x\leq0.2$,
$(AE_{1-x}Eu_x)Al_{10}O_{17}$ with $0<x\leq0.2$ and combinations thereof, wherein RE is one or more of Y, Lu, Tb and Gd, AE is one or more of Mg, Ca, Sr, Ba, A' is one or more of Sc and Ga, wherein the phosphors optionally include one or more of halides.

The phosphor material present in the polysiloxane layer might be a pure phosphor material of one kind of phosphor material, or might be a mixture of different phosphor materials.

The phosphor material might be present in the polysiloxane layer in an amount of between about 5 to about 70 vol %, preferably in an amount of between about 20 to about 60 vol %, based on the total volume of the luminescent layer. Herein, the luminescent layer is the layer comprising the polysiloxane, the phosphor material and optional additives.

The polysiloxane layer might additionally comprise at least one additive. Additives might be filler materials, hardeners, or viscosity modifiers.

The additional filler materials might influence the properties of the polysiloxane. Exemplary filler materials are all types of silica and polymorphs thereof including coated silicas, all types of glass particles, such as borosilicate, aluminosilicate, etc., glass or silica fibers, nanoparticles of zirconia, titania, alumina, or combinations thereof, wetting agents, such as polyethersiloxanes (i.e., siloxanes comprising $(C-O)_n$ units), amino silanes, etc.

The total filler material might be present in an amount of between about 1 to about 50 vol % based on the total volume of the luminescent layer.

The additional filler materials might have a size from about 1 nm to 50 μm in diameter. E.g., glass particles might be present in the size from 1 nm to 50 μm in diameter.

The polysiloxane layer might additionally comprise a hardener. The hardener might be selected from titanium alkoxides (e.g., titanium n-butoxide), zirconium alkoxides, aluminum alkoxides, organo-tin compounds, amines (e.g., tetra methyl guanidine), or combinations thereof.

The hardener might be present in an amount of between about 0.1 wt % to about 5 wt % based on the polysiloxane The polysiloxane layer may have a thickness of between about 10 μm to about 200 μm, preferably of about 20 μm to about 100 μm The wavelength converter of the present invention may additionally comprise at least one further layer. The further layer might be e.g., a cover layer that protects the substrate and/or the polysiloxane layer from environmental or mechanical impact, e.g., humidity, unwanted radiation or during handling.

In an alternative embodiment, the wavelength converter may comprise a non-luminescent substrate layer and more than one polysiloxane layer, wherein the polysiloxane layers comprise one or more polysiloxanes and one or more phosphor materials.

The wavelength converter may comprise e.g., two, three, four or more polysiloxane layers.

A wavelength converter may comprise e.g., a non-luminescent substrate layer and two polysiloxane layers on top of the substrate layer. The polysiloxane layers may comprise the same polysiloxane or may comprise different polysiloxanes. The polysiloxane layers may comprise the same phosphor material, or may comprise different phosphor materials. With more than one polysiloxane layer comprising different phosphor materials it is e.g. possible to design the resulting emitted colour.

Alternatively, the wavelength converter may comprise a non-luminescent substrate layer and two polysiloxane layers, wherein the layers are positioned in a sandwich structure, i.e., the substrate layer represents the center layer and the polysiloxane layers are each positioned on the top and on the bottom of the substrate layer. The polysiloxane layers may comprise the same polysiloxane or may comprise different polysiloxanes. The polysiloxane layers may comprise the same phosphor material, or may comprise different phosphor materials. With more than one polysiloxane layer comprising different phosphor materials it is e.g. possible to design the resulting emitted colour.

A sandwich configuration might be advantageous for certain applications. The choice of which phosphor material(s) would be in which polysiloxane layer, and which polysiloxane layer would be glued to the light source in light emitting devices, could depend on which property should be highlighted or which loss mechanism should be mitigated. For example, separate polysiloxane layers comprising phosphor material(s) might limit the amount of phosphor re-absorption, might limit thermal quenching, or might limit excited state saturation of phosphors with longer radiative lifetimes.

The dimensions of the wavelength converter might be length and width: 500 μm to 5 mm.

The present invention is further directed to a method for preparing a wavelength converter, the method comprising:
providing a non-luminescent substrate layer;
providing a slurry comprising a polysiloxane precursor material and a phosphor material;
depositing the slurry on the non-luminescent substrate layer;
application of a first cure step; and application of a second cure step.

The non-luminescent substrate layer may be any substrate layer as described herein.

In a further embodiment, the non-luminescent substrate layer is selected from borosilicate glass, glass, sapphire, fused silica and polycrystalline ceramics.

Preferably, the non-luminescent substrate is cleaned and optionally polished prior to the application of the further method steps. Furthermore, any surface irregularities might be removed or treated.

The method for preparing a wavelength converter of the present invention comprises the step of providing a slurry comprising a polysiloxane precursor material and a phosphor material.

In one embodiment, the polysiloxane precursor is a low viscosity, low molecular weight siloxane species or mixture of low viscosity, low molecular weight siloxane species.

The polysiloxane precursor might generally be described according to formula (II):

(II)

wherein $0.65 \leq a \leq 1$ and $0 \leq b \leq 0.35$ and $0 \leq c \leq 0.35$ and $a+b+c=1$, preferably, wherein $0.8 \leq a \leq 1$ and $0 \leq b < 0.2$ and $0 \leq c < 0.2$; $T^1$ is independently selected from a linear or branched alkyl (e.g., $C_1$-$C_4$ alkyl) and alkoxy (e.g., $C_1$-$C_4$ alkoxy); $T^2$ is a linear or branched alkyl (e.g. $C_1$-$C_4$ alkyl); $R^1$, $R^2$ and $R^3$ are independently selected from a linear or branched alkyl (e.g., $C_1$-$C_4$ alkyl) and phenyl. The alkyl may be $C_1$-$C_4$ alkyl (i.e., methyl, ethyl, propyl, butyl), wherein methyl is preferred.

In an embodiment, $R^1$ to $R^3$ is methyl, $T^1$ is methoxy and $T^2$ is methyl. In a further embodiment $R^1$ to $R^3$ is phenyl, $T^1$ is methoxy and $T^2$ is methyl. In an alternative embodiment $R^1$ to $R^3$ are independently selected from methyl and phenyl. In an alternative embodiment $R^1$ could be any combination of methyl and phenyl, $R^2$ could be any combination of methyl and phenyl, and $R^3$ could be any combination of methyl and phenyl.

In an embodiment, the precursor species is/are methyl methoxy siloxane(s), and their simplified chemical structure is formula of (II), wherein $R^1$ is $CH_3$, $T^1$ is —$OCH_3$ and $T^2$ is $CH_3$ and b, c is 0. Each methoxy (—$OCH_3$) group has the potential to react and participate in a new siloxane bond. In the presence of water—preferably just the naturally occurring water vapor in the air—and optionally a hardener, the methoxy groups are hydrolyzed into silanol groups. These silanol groups then may condense with each other to form new siloxane bonds.

The polysiloxane precursor may be of the linear type, the branched type, or may have any combination of the linear and branched structural features.

In an embodiment, the polysiloxane precursor has an average alkoxy content (e.g., methoxy content) of between about 10 wt. % to about 50 wt. %, preferably of between about 15 wt. % to about 35 wt. %, based on the overall weight of the polysiloxane precursor. The polysiloxane precursor may have an average viscosity of between about 1 mPa·s to about 500 mPa·s, preferably of between about 5 mPa·s to about 100 mPa·s. The polysiloxane precursor may have an average density of between about 1 g/cm³ to about 1.2 g/cm³. The polysiloxane may have an average molecular weight of less than about 4500 g/mol, preferably less than about 1000 g/mol and more preferably less than about 500 g/mol.

The slurry might further comprise a viscosity modifier. An exemplary viscosity modifier to increase the viscosity of the slurry is fumed silica. The fumed silica may be a hydrophobic fumed silica, or a hydrophilic fumed silica. When mixed with the polysiloxane precursor, the hydrophobic and hydrophilic fumed silicas lead to composites with different properties.

The concentration of the viscosity modifier (e.g., the fumed silica) in the precursor material is between about 1 vol. % to about 50 vol. %, preferably between about 5 vol. % to about 30 vol. %, based on the total weight of the slurry.

The slurry might further comprise at least one hardener. The hardener may be added to initiate the hydrolysis and/or condensation reactions of the polysiloxane precursor. The hardener may be selected from metal alkoxides.

The hardener might be selected from titanium alkoxides (e.g., titanium n-butoxide), zirconium alkoxides, aluminum alkoxides, organo-tin compounds, amines (e.g., tetra methyl guanidine), or combinations thereof.

The hardener might be added in a concentration of between about 0.1 wt. % to about 5 wt. %, preferably of between about 0.5 wt. % to about 2.0 wt. % based on the total weight of the polysiloxane precursor.

The slurry further comprises a phosphor material. The phosphor material might be selected from any phosphor material known to the person skilled in the art. In an embodiment, the phosphor material is selected form the phosphor material described herein. The selection of the phosphor material depends at least on the application requirements. In an exemplary embodiment, any photoluminescent material, i.e., phosphor material that absorbs in the near-UV to cyan region of the spectrum, and emits in the visible and/or near-IR region is compatible with the invention.

The phosphor material might be an inorganic compound. Exemplary phosphors are garnets, oxynitridosilicates, perovskits, quantum dots, silicates or combinations thereof, each doped with at least one appropriate element.

Non-limiting examples of phosphor materials are:
$(RE_{1-x}Ce_x)_3(Al_{1-y}A'_y)_5O_{12}$ with $0<x\leq0.1$ and $0\leq y\leq1$,
$(RE_{1-x}Ce_x)_3(Al_{5-2y}Mg_ySi_y)O_{12}$ with $0\leq x\leq0.1$ and $0\leq y\leq2$,
$(RE_{1-x}Ce_x)_3Al_{5-y}Si_yO_{12-y}N_y$ with $0\leq x\leq0.1$ and $0\leq y\leq0.5$,
$(RE_{1-x}Ce_x)_2CaMg_2Si_3O_{12}$:$Ce^{3+}$ with $0<x\leq0.1$,
$(AE_{1-x}Eu_x)_2Si_5N_8$ with $0<x\leq0.1$,
$(AE_{1-x}Eu_x)AlSiN_3$ with $0<x\leq0.1$,
$(AE_{1-x}Eu_x)_2Al_2Si_2N_6$ with $0<x\leq0.1$,
$(Sr_{1-x}Eu_x)LiAl_3N_4$ with $0<x\leq0.1$,
$(AE_{1-x}Eu_x)_3Ga_3N_5$ with $0<x\leq0.1$,
$(AE_{1-x}Eu_x)Si_2O_2N_2$ with $0<x\leq0.1$,
$(AE_xEu_y)Si_{12-2x-3y}Al_{2x+3y}O_yN_{16-y}$ with $0.2\leq x<2.2$ and $0<y\leq0.1$,
$(AE_{1-x}Eu_x)_2SiO_4$ with $0<x\leq0.1$,
$(AE_{1-x}Eu_x)_3Si_2O_5$ with $0<x\leq0.1$,
$K_2(Si_{1-x-y}Ti_yMn_x)F_6$ with $0<x\leq0.2$ and $0<y\leq1-x$,
$(AE_{1-x}Eu_x)_5(PO_4)_3Cl$ with $0<x\leq0.2$,
$(AE_{1-x}Eu_x)Al_{10}O_{17}$ with $0<x\leq0.2$ and combinations thereof, wherein RE is one or more of Y, Lu, Tb and Gd, AE is one or more of Mg, Ca, Sr, Ba, A' is one or more of Sc and Ga, wherein the phosphors optionally include one or more of halides.

In an embodiment, the phosphor material is in the form of a crystalline powder. It may have a particle size ($d_{50}$) of between about 5 to about 50, preferably of between about 10 to about 30 μm.

In a further embodiment, the phosphor material is in the form of a quantum dot. Quantum dots may have a particle size of 1 nm to 20 nm.

The slurry might further comprise additional materials, such as filler materials.

The additional filler materials might influence the properties of the polysiloxane. Exemplary filler materials are all types of silica and polymorphs thereof including coated silicas, all types of glass particles, such as borosilicate, aluminosilicate, etc., glass or silica fibers, nanoparticles of zirconia, titania, alumina, or combinations thereof, wetting agents, such as polyethersiloxanes, amino silanes, etc.

The materials described herein might be mixed thoroughly using any of the known mixing and/or milling technologies to prepare the slurry. In an embodiment, the hardener is added last and mixed in just prior to further processing of the slurry.

In a further method step, the slurry is deposited on the non-luminescent substrate layer. Preferably, the non-luminescent substrate layer is clean, prior to depositing the slurry on the non-luminescent substrate layer. The application of the slurry onto the non-luminescent substrate could be accomplished by a number of techniques known to the person skilled in the art.

The slurry might be deposited on the non-luminescent substrate layer on one side of the substrate layers or on opposing sides of the substrate layers.

In a further method step, a first cure step is applied. The first cure step is preferably applied at room temperature, i.e. 25° C.

The second cure step is preferably implemented to promote further condensation and cross-linking. Preferably, the end result after the second cure step is a phosphor-filled, highly crosslinked, solid polysiloxane layer directly adhered to the substrate.

The method of the present invention may further comprise the step of singulation the wavelength converter. After the final cure step in the method for preparing the wavelength converter, the wavelength converter might be singulated to the size needed for a given application. The singulation could be accomplished in many ways. Exemplary singulation methods are, e.g., sawing, scribe-and-break, laser dicing, etc. After the singulation step, the wavelength converter may be incorporated into a light emitting device.

The lateral size and shape of the wavelength converter are variable depending e.g., on the size of the light source (e.g., the LED chip) that is used to emit photons in a light emitting device. Most typically, light sources (e.g., LED chips) are rectangular and have areas in the range of 0.01 $mm^2$ to 16 $mm^2$. Therefore, the typical sizes of the wavelength converter would be in that same size range, but not necessarily limited to it. For example, the wavelength converter could be used in conjunction with multiply light sources (e.g., LED chips), and therefore have areas much larger than 16 $mm^2$.

As the method for preparing the wavelength converter does not require high temperature or harsh solvents, the wavelength converter is compatible with nearly all phosphors, so different colors from blue to red, including combinations (e.g. cool- and warm-white blends), are possible. Phosphor materials that emit outside of the visible spectrum, e.g. near-IR, are also possible.

Whereas silicone-based converters are relatively soft, and therefore are difficult to singulate by saw dicing, the wavelength converters disclosed herein may be harder and can be singulated easily e.g., by saw dicing.

Because the polysiloxane precursor material is a liquid, it is possible to incorporate different additives into the wavelength converter, such as nanoparticles, metal alkoxy precursors, organic molecules, polymers, etc. If additives are desired, they could serve different purposes, such as controlling the viscosity during the fabrication, providing crack resistance and enhanced mechanical strength, tuning the refractive index, increasing thermal conductivity, and so on.

The disclosed polysiloxane may be much less permeable to liquids and gases than a corresponding traditional silicone material, which can help to protect the other packaging materials.

The present invention is also directed to a wavelength converter prepared by a method of the present invention.

The present invention is also directed to a light emitting device comprising:
a light source; and
at least one wavelength converter described herein.

The light emitting device is preferably an optoelectronic device, such as an LED package.

The light source typically emits UV light or blue light. The light source might be a blue light emitting diode (LED) chip.

The light-emitting device might further comprise a frame or a board as carrier for the wavelength converter and the light source. The light emitting device might also comprise reflective material. The light emitting device might further comprise one or more cover layers to protect the components of the light emitting device from e.g., humidity or other environmental impact.

The wavelength converter might be connected to the light source in the light emitting device in different ways. In a preferred embodiment, the polysiloxane layer is attached in close proximity to the light source. Preferably, the polysiloxane layer of the wavelength converter is glued directly to the light source's light emitting surface. For the thermal management it might be advantageous to glue the polysiloxane layer in close proximity to the light source and not the non-luminescent substrate layer to the light source's surface.

The present invention is also directed to a method for preparing a light emitting device, the method comprising the steps of:
providing a light source;
depositing a wavelength converter according to the present invention on the light source;
wherein the polysiloxane layer comprising the phosphor material is in close proximity to the light source.

The light source may be any light source as described herein. The light source typically emits UV light or blue light. The light source might be a blue light emitting diode (LED) chip.

In a further step, a wavelength converter of the present invention is deposited on the light source. The wavelength converter might be connected to the light source in the light emitting device in different ways. In a preferred embodiment, the polysiloxane layer is attached in close proximity to the light source. Preferably, the polysiloxane layer of the wavelength converter is glued directly to the light source's light emitting surface. For the thermal management it is advantageous to glue the polysiloxane layer in close proximity to the light source and not the non-luminescent substrate layer to the light source's surface.

In an alternative embodiment, the non-luminescent substrate layer of the wavelength converter might be attached, e.g. glued, to the light source and therefore the non-luminescent substrate layer would be in close proximity to the light source.

In embodiments, wherein the wavelength converter comprises more than one polysiloxane layers, e.g., two, three, four, or more layers, the substrate layer may be attached to the light source, or one of the polysiloxane layers may be attached to the light source.

The present invention is further directed to the use of the light emitting device of the present invention e.g., in applications with an operating current 1A, a current density of ≥1 A/mm² and increased ambient temperature. In an embodiment, the light-emitting device is used in automotive industry, projection, stage lighting, etc.

Illustrative embodiments are depicted in the attached figures.

Figure 1:
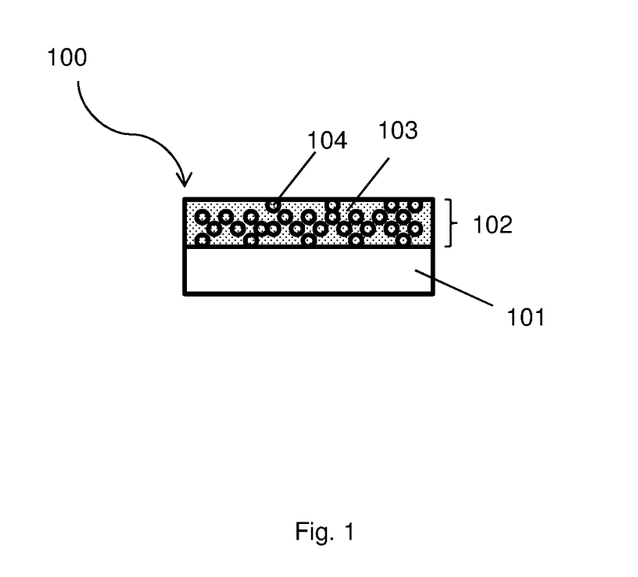
FIG. 1 shows a schematic view of a wavelength converter.

FIG. 1 shows a schematic view of an exemplary wavelength converter 100 of the present invention. Wavelength converter 100 comprises a substrate layer 101 and a polysiloxane layer 102. The polysiloxane layer 102 comprises a polysiloxane 103 and a phosphor material 104. The phosphor material 104 may be the same, or may be different.

Figure 2:
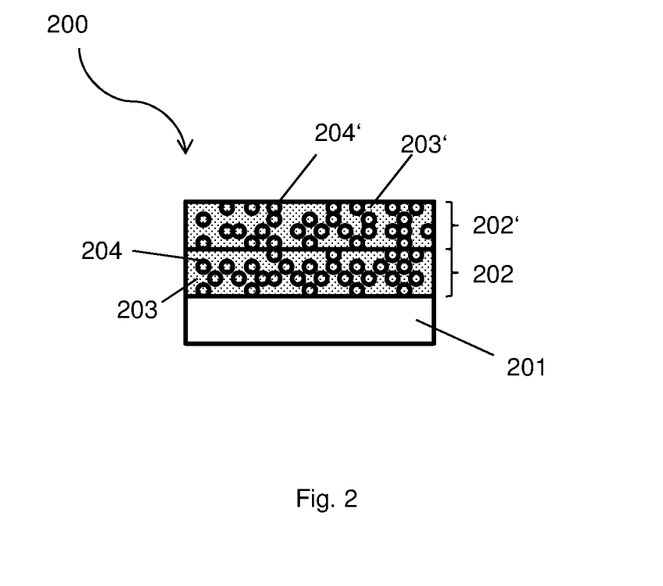
FIG. 2 shows a schematic view of a wavelength converter.

FIG. 2 shows a schematic view of an exemplary wavelength converter 200 of the present invention. Wavelength converter 200 comprises a substrate layer 201 and two polysiloxane layers 202 and 202'. The polysiloxane layers 202 and 202' each comprise a polysiloxane 203 and 203' and a phosphor material 204 and 204'. The polysiloxane 203 and 203' may be the same or may be different. The phosphor material 204 and 204' may be the same or may be different.

Figure 3:
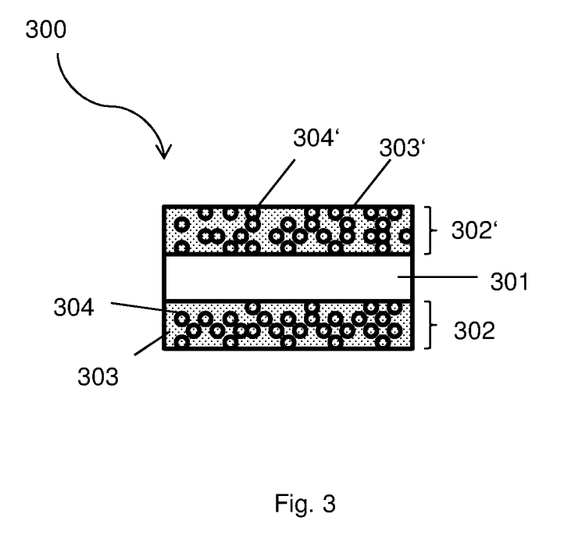
FIG. 3 shows a schematic view of a wavelength converter.

FIG. 3 shows a schematic view of an exemplary wavelength converter 300 of the present invention. Wavelength converter 300 comprises a substrate layer 301 and two polysiloxane layers 302 and 302'. The polysiloxane layers 302 and 302' each comprise a polysiloxane 303 and 303' and a phosphor material 304 and 304'. The polysiloxane 303 and 303' may be the same or may be different. The phosphor material 304 and 304' may be the same or may be different. The structure of the wavelength converter 300 may be called a sandwich structure.

Figure 4:
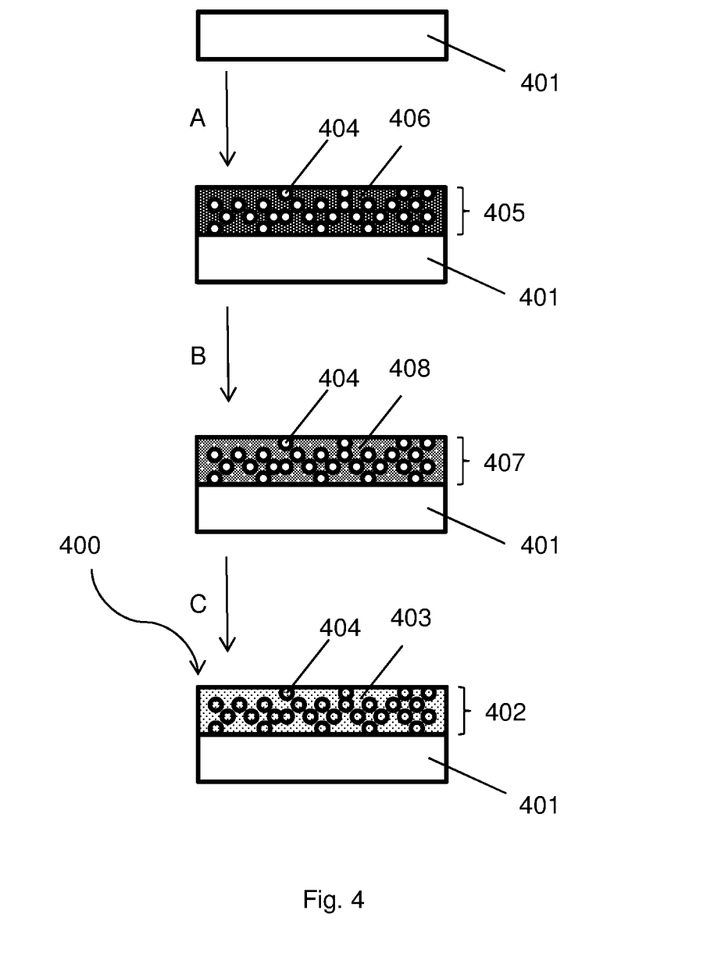
FIG. 4 shows an exemplary method for preparing a wavelength converter.

FIG. 4 shows an exemplary method for preparing a wavelength converter 400. In a first step, a substrate layer 401 is provided. The substrate layer 401 may be cleaned or prepared for further processing. In a further step, the slurry 405 is provided and deposited on the substrate layer 401 (step A). The slurry comprises a polysiloxane precursor 406 and phosphor material 404. In a further step B, the polysiloxane precursor material is pre-cured (e.g., at room temperature) to provide the procured polysiloxane precursor layer 407 on the substrate layer 401. The precured polysiloxane layer 407 comprises the procured polysiloxane 408 and the phosphor material 404. In a further step C, the precured polysiloxane 408 is cured at elevated temperatures (e.g., between 50° C. to 325° C.), typically for several hours to provide the wavelength converter 400 comprising the highly crosslinked, solid polysiloxane layer 402, which is directly attached to the substrate 401. The polysiloxane layer 402 comprises the polysiloxane 403 and the phosphor material 404.

Figure 5:
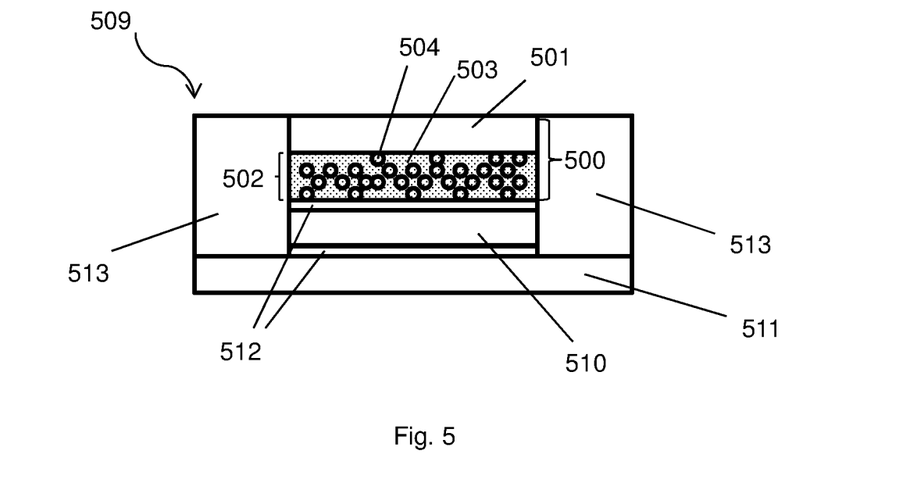
FIG. 5 shows a schematic view of a light emitting device.

FIG. 5 shows a schematic view of an exemplary light emitting device 509 (e.g., a LED package). The light emitting device 509 comprises a board 511. A light source 510 (e.g., a LED chip) is attached to the board 511. The attachment is preferably carried out by gluing and therefore an adhesion layer 512 is between the board 511 and the light source 510. A wavelength converter 500 is attached to the light source 510. The wavelength converter 500 is preferably glued to the light source 510 and therefore, an adhesion layer 512 is between the light source 510 and the wavelength converter 500. The adhesion layer 512 between the board 511 and the light source 510 may be the same as the adhesion layer 512 between the light source 510 and the wavelength converter 500, or may be different. The wavelength converter comprises a substrate 501 and a polysiloxane layer 502, comprising a polysiloxane 503 and phosphor material 504. In FIG. 5, the polysiloxane layer 502 is in close proximity to the surface of the light source 510. This configuration is advantageous in view of thermal management. The light emitting device 509 further comprises reflective material 513.

Figure 6:
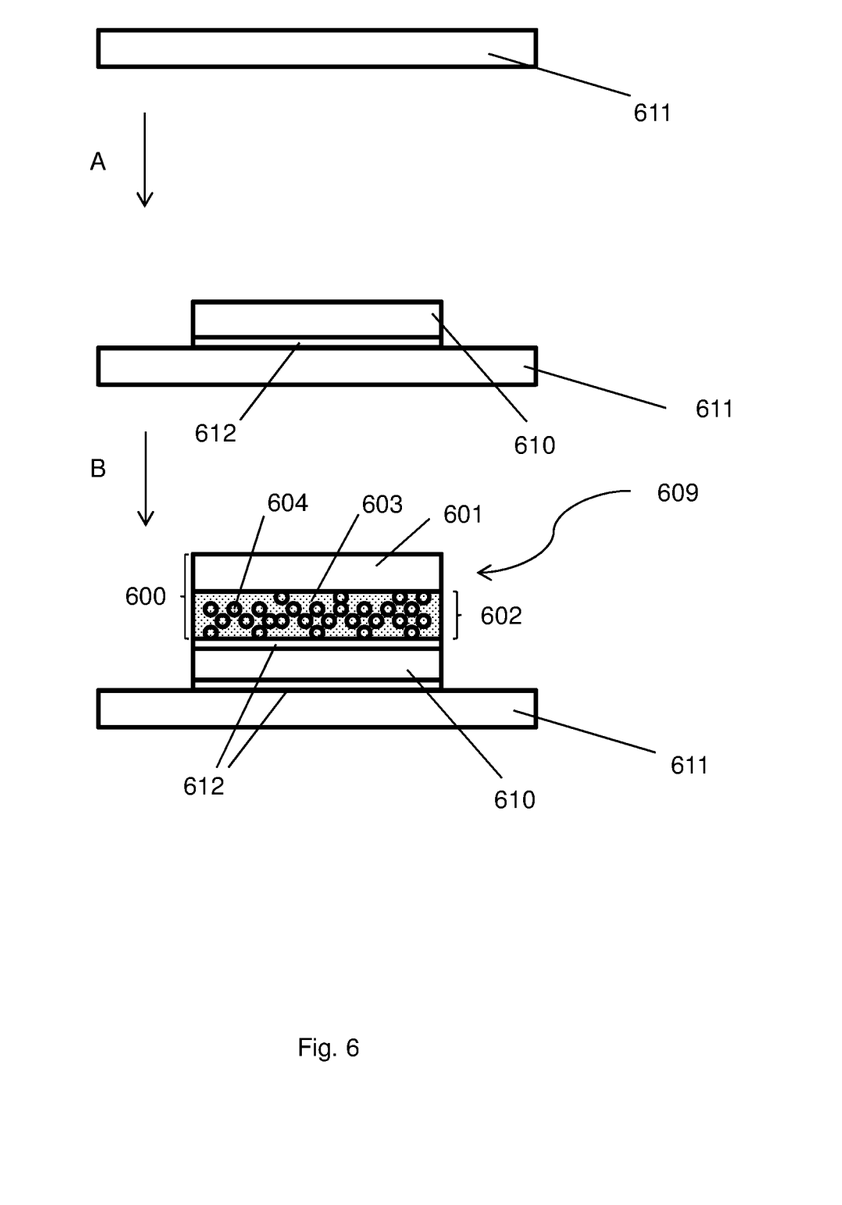
FIG. 6 shows an exemplary method for preparing a light emitting device.

FIG. 6 shows an exemplary method for preparing a light emitting device 609. In a first step, a board 611 is provided. The board 611 may be cleaned or prepared for further processing. In a further step, a light source 610 is provided and deposited on the board 611 and attached via adhesive layer 612 (step A). In a further step B, the wavelength converter 600 is deposited on the light source 610 and attached to the light source 610 via an adhesive layer 612. The light emitting device 609 comprises the board 611, adhesion layers 612, the light source 610 and the wavelength converter 600. The wavelength converter 600 comprises the substrate layer 601 and the polysiloxane layer 602. The polysiloxane layer comprises the polysiloxane 603 and the phosphor material 604. In a further step (not depicted), additional layers may be introduced, such as protective layers, means like reflective material, etc. may be introduced.

Figure 7:
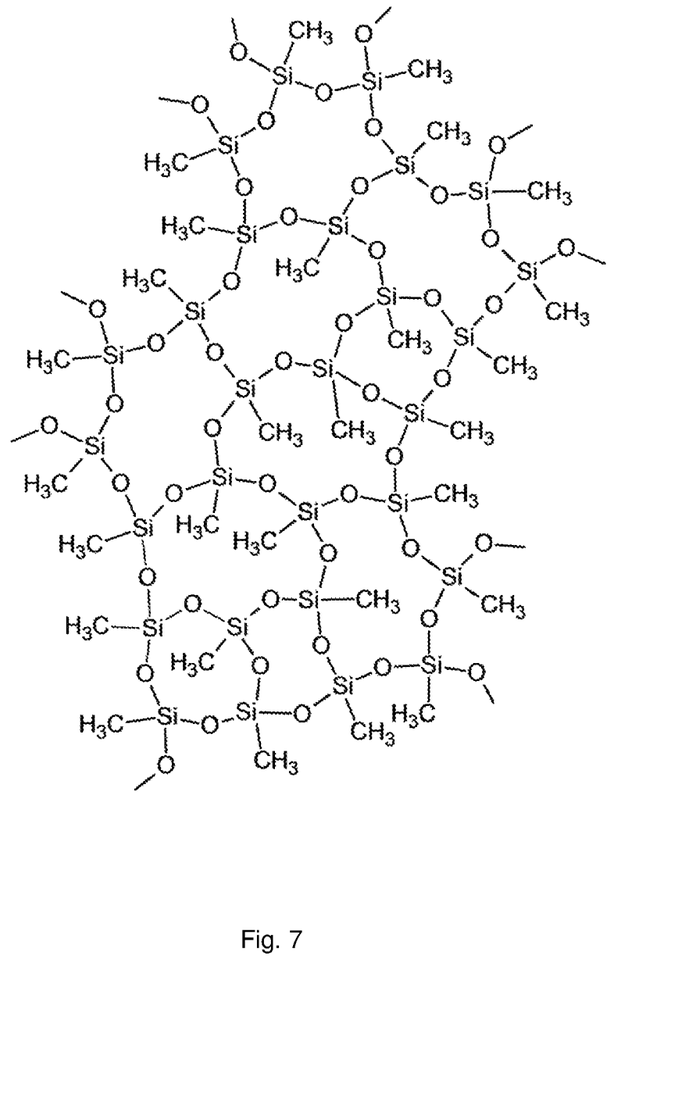
FIG. 7 shows an exemplary polysiloxane.

FIG. 7 shows an exemplary structure of a highly crosslinked polysiloxane that could result from the hydrolysis and condensation of the precursor of formula (II), wherein $R^1$ to $R^3$, $T^1$ and $T^2$ are $CH_3$. The dangling bonds indicate ta continuation of the structure. FIG. 7 shows a small portion of the idealized polysiloxane network that would result if all the precursor methoxy groups condensed and formed new siloxane bonds. In reality, not all of the methoxy groups would necessarily result in cross-linking. Some of them might remain intact and some of them might be replaced by silanol groups that do not undergo condensation. The structure shown in FIG. 7 is simplified for clarity—the actual structure is a much more extensive, three-dimensional, network. When the siloxane is cured each silicon atom has three oxygen bonds and one carbon bond, i.e., all the siloxane bonding is of the T-unit type. It also shows that there are no C—C bonds involved in the cross-linked polymer chains.

This invention makes it possible to prepare a photothermally-stable wavelength converter, comprised of one (or more) phosphor material(s)—usually in powder form—dispersed in a highly crosslinked polysiloxane matrix, arranged in a layered configuration, such that in a light emitting device, the phosphor material is located in close proximity to the light source (e.g., the LED chip). Having the phosphor in close proximity to the light source is for some embodiments crucial for good thermal management because heat is generated in the down-conversion process and the main heat-flow path is down through the light source. Advantages of this invention may be:

The wavelength converter is more thermally stable than an analogous material based on a standard optical silicone matrix. In this context, a standard optical silicone can be described as having: (i) primarily D-unit siloxane bonding in the polymer chains; (ii) cross-linking that is accomplished by addition curing, using a platinum-based (or similar)

catalyst, which results in the formation of carbon-carbon bonds; and (iii) uncured viscosities of greater than 500 mPa-s.

The wavelength converter of the present invention may be more thermally stable than a standard silicone at least due to two primary reasons. The polysiloxane matrix disclosed here may have less organic content than a standard optical silicone. The cross-linked polysiloxane matrix disclosed here may not have any carbon-carbon bonds in the polymer network, which are often less photo-thermally stable than Si—O bonds.

While there have been shown and described what are at present considered to be preferred embodiments of the invention, it will be apparent to those skilled in the art that various changes and modifications can be made herein without departing from the scope of the invention as defined by the appended claims. The disclosure rather comprises any new feature as well as any combination of features, which in particular includes any combination of features in the appended claims, even if the feature or combination is not per se explicitly indicated in the claims or the examples.

What is claimed is:

1. A wavelength converter comprising:
a non-luminescent substrate layer; and
at least one polysiloxane layer,
wherein at least one of the polysiloxane layers comprises a phosphor material,
wherein the polysiloxane layer comprises a polysiloxane of formula:

wherein $0.65 \leq a \leq 1$ and $0 \leq b < 0.35$ and $0 \leq c < 0.35$ and $a+b+c=1$, wherein $T^1$ is independently selected from a linear or branched alkyl and alkoxy, wherein $T^2$ is a linear or branched alkyl, and wherein $R^1$, $R^2$ and $R^3$ are independently selected from a linear or branched alkyl and phenyl.

2. The wavelength converter according to claim 1, wherein the non-luminescent substrate layer comprises borosilicate glass, glass, sapphire, fused silica or polycrystalline ceramics.

3. The wavelength converter according to claim 1, wherein the phosphor material is a crystalline powder, a polycrystalline powder, a semi-crystalline powder, amorphous powder or quantum dot.

4. The wavelength converter according to claim 1, wherein the wavelength converter comprises one polysiloxane layer comprising the phosphor material.

5. The wavelength converter according to claim 1, wherein $T^1$, $T^2$ and $R^1$ are methyl and b, c=0.

6. A light emitting device comprising:
a light source; and
at least one wavelength converter according to claim 1.

7. A method for using the light emitting device according to claim 6, the method comprising:
using the light emitting device in an automotive industry, a projection or a stage lighting.

* * * * *